(12) United States Patent
Chen et al.

(10) Patent No.: US 8,169,272 B2
(45) Date of Patent: May 1, 2012

(54) MULTI-PHASE PULSE MODULATION POLAR TRANSMITTER AND METHOD OF GENERATING A PULSE MODULATED ENVELOPE SIGNAL CARRYING MODULATED RF SIGNAL

(75) Inventors: Jau-Horng Chen, Taipei (TW); Yi-Jan Emery Chen, Taipei (TW)

(73) Assignee: National Taiwan University, Taipei (TW)

( * ) Notice: Subject to any disclaimer, the term of this patent is extended or adjusted under 35 U.S.C. 154(b) by 93 days.

(21) Appl. No.: 12/855,328

(22) Filed: Aug. 12, 2010

(65) Prior Publication Data

US 2011/0254636 A1 Oct. 20, 2011

(30) Foreign Application Priority Data

Apr. 16, 2010 (TW) ................ 99111917 A

(51) Int. Cl.
*H03C 3/00* (2006.01)
*H03C 3/38* (2006.01)
*H03K 7/00* (2006.01)
*H03K 7/10* (2006.01)

(52) U.S. Cl. .............. 332/108; 332/103; 332/145

(58) Field of Classification Search .......... 332/103–106, 332/108–111, 144, 145, 149, 151
See application file for complete search history.

(56) References Cited

U.S. PATENT DOCUMENTS 6,603,818 B1 * 8/2003 Dress et al. ............... 375/295

OTHER PUBLICATIONS

"Single-sideband transmission by envelope elimination and restoration" (Proc. of the IRE, pp. 803-806, Jul. 1952, L. R. Kahn).
"An envelope elimination and restoration power amplifier using a CMOS dynamic power supply circuit" (IEEE MTT-S Int. Microwave Symp. Dig., vol. 3, pp. 1591-1522, Jun. 2004, J.-H. Chen, K. U-Yen, and J. S. Kenney).
"L-band transmitter using Kahn EER technique" (IEEE Trans. Microwave Theory Tech., vol. 46, No. 12, pp. 2220-2225, Dec. 1998, F. H. Raab, B. E. Sigmon, R. G. Myers, and R. M. Jackson).
"An improved Kahn transmitter architecture based on Delta-Sigma Modulation" (IEEE MTT-S Int. Microwave Symp. Dig., vol. 3, pp. 1327-1330, Jun. 2004, Y. Wang).
"An EER transmitter architecture with burst-width envelope modulation based on triangle-wave comparison PWM" (Proc. IEEE Int. Symp. PIMRC, pp. 1-5, Sep. 2007, M. Taromaru, N. Ando, T. Kodera, and K. Yano).
"A transmitter architecture for nonconstant envelope modulation" (IEEE Trans. Circuit and Syst. II, vol. 53, No. 1, pp. 13-17, Jan. 2006, C. Berland, I. Hibon, J. F. Bercher, M. Villegas, D. Belot, D. Pache, and V. Le Goasccoz).

* cited by examiner

*Primary Examiner* — David Mis
(74) *Attorney, Agent, or Firm* — Peter F. Corless; Steven M. Jensen; Edwards Wildman Palmer LLP

(57) ABSTRACT

A multi-phase pulse-modulated polar transmitter and a method of generating a pulse-modulated envelope signal carrying modulated RF signal. Multi-phase pulse modulation technique or similar multi-phase pulse modulation techniques are employed in conjunction with a plurality of power amplifiers to enhance the bandwidth of the transmitter and to reduce out-of-band emissions and noises while easily synchronizing the phase and envelope of the input signal.

9 Claims, 7 Drawing Sheets

MULTI-PHASE PULSE MODULATION POLAR TRANSMITTER AND METHOD OF GENERATING A PULSE MODULATED ENVELOPE SIGNAL CARRYING MODULATED RF SIGNAL

CROSS-REFERENCES TO RELATED APPLICATIONS

This application claims under 35 U.S.C. §119(a) the benefit of Taiwanese Application No. 99111917 filed Apr. 16, 2010 the entire contents of which is incorporated herein by reference.

BACKGROUND OF THE INVENTION

1. Field of the Invention

This invention relates to using a multi-phase pulse modulation technique to implement a wideband polar transmitter, and more particularly, to a multi-phase pulse-modulated polar transmitter and a method of generating pulse-modulated envelop signals carrying modulated RF signal that may enhance the efficiency and bandwidth of a power amplifier and reduce out-of-band emissions.

2. Description of Related Art

In general, a power amplifier has long been known as the most power-consuming component in a radio-frequency (RF) transmitter. By improving the power amplifier efficiency, the overall battery life can be greatly increased. The envelope elimination and restoration (EER) method, which was first proposed in "Single-sideband transmission by envelope elimination and restoration" (Proc. of the IRE, pp. 803-806, July 1952, L. R. Kahn), may efficiently amplify RF signals. The EER method splits the RF signal into a constant-envelope modulated signal and an envelope signal, amplifies the constant-envelope signal, and restores the signal based on the envelope signal, respectively, such that high overall power efficiency may be attained.

The EER method is implemented in "An envelope elimination and restoration power amplifier using a CMOS dynamic power supply circuit" (IEEE MTT-S Int. Microwave Symp. Dig., vol. 3, pp. 1591-1522, June 2004, J.-H. Chen, K. U-Yen, and J. S. Kenney) and "L-band transmitter using Kahn EER technique" (IEEE Trans. Microwave Theory Tech., vol. 46, no. 12, pp. 2220-2225, December 1998, F. H. Raab, B. E. Sigmon, R. G. Myers, and R. M. Jackson), in which a highly efficient power supply circuit is used to dynamically modulate the drain or collector of a non-linear, but highly-efficient RF power amplifier. One of the major problems in implementing a Kahn EER transmitter is to synchronize the phase and envelope paths. The non-synchronization of the phase and envelope paths may create unwanted the out-of-band emissions. Conventional EER transmitters use an L-C low-pass filter to filter the output of the switching envelope amplifier or dynamic bias circuit. The low-pass filter, however, creates significant delay that requires the phase data to be delayed accordingly using shift registers or delay circuits. For these transmitters, the phase information may require as many as 16 bits per clock for storage. Using the shift registers to store such data may adversely increase the area and cost of the transmitter.

Pulse modulation of the input signals using sigma-delta modulation ($\Sigma$-$\Delta$ Modulation) for implementing a Kahn EER transmitter has been proposed in "An improved Kahn transmitter architecture based on Delta-Sigma Modulation" (IEEE MTT-S Int. Microwave Symp. Dig., vol. 3, pp. 1327-1330, June 2004, Y. Wang), "An EER transmitter architecture with burst-width envelope modulation based on triangle-wave comparison PWM" (Proc. IEEE Int. Symp. PIMRC, pp. 1-5, September 2007, M. Taromaru, N. Ando, T. Kodera, and K. Yano) and "A transmitter architecture for nonconstant envelope modulation" (IEEE Trans. Circuit and Syst. II, vol. 53, no. 1, pp. 13-17, January 2006, C. Berland, I. Hibon, J. F. Bercher, M. Villegas, D. Belot, D. Pache, and V. Le Goasccoz). The main benefit of using this technique is the omission of the low-pass filter in the envelope path. By omitting the low-pass filter, the delay in the envelope path is reduced significantly, and hence synchronizing the phase and envelope paths using shift registers may be simplified. However, the use of the EER method requires high quality band-pass filters to filter the unwanted out-of-band emissions created by pulse modulation or SDM noises, which hampers the wide use of the EER method. Pulse modulation of the input signals using pulse-width modulation (PWM) was shown in "A transmitter architecture for nonconstant envelope modulation" (IEEE Trans. Circuit and Syst. II, vol. 53, no. 1, pp. 13-17, January 2006, C. Berland, I. Hibon, J. F. Bercher, M. Villegas, D. Belot, D. Pache, and V. Le Goasccoz), but was concluded as unattractive since spurious emissions are too high.

The aforesaid conventional EER transmitters require the use of envelope detectors and RF limiters to obtain the constant-envelope modulated RF signal. Thanks to the advancement of modern digital signal processing technology, it is now possible to directly generate the phase and envelope signals digitally to implement a polar transmitter. The polar transmitter may be applied in cellular phones for CDMA2000 and W-CDMA standards. In the related applications, a high quality bass-pass filter is required at the output end of the transmitter to suppress the unwanted out-of-band emissions generated from the PWM. The modern cellular phones supporting CDMA2000 and W-CDMA standards have high quality surface-acoustic-wave (SAW) filters between the antennas and the power amplifiers. However, unless the PWM sampling frequency is sufficiently high, the SAW filter alone is not adequate to suppress the unwanted out-of-band emissions.

Therefore, how to provide a polar transmitter that may resolve the drawbacks of the prior art, to suppress the out-of-band emissions generated from the PWM and enhance the signal bandwidth and efficiency of the power amplifier, is crucial for handset power amplifier development.

SUMMARY OF THE INVENTION

In view of the aforementioned problems of the prior art, the present invention provides a multi-phase pulse-modulated polar transmitter that includes an envelope signal input end for receiving envelope signals; a plurality of constant-envelope radio-frequency (RF) signal input ends, each being for receiving input constant-envelope RF signals; a multi-phase pulse modulation module for receiving the envelope signals from the envelope signal input ends, so as to generate multi-phase pulse-modulated signals according to the envelope signals; a plurality of signal modulation modules, each being for receiving one of the constant-envelope RF signals and modulating the received one of the constant-envelope RF signals according to one of the multiphase pulse-modulated signals, to thereby generate pulse-modulated RF signals that an envelope of each of the pulse-modulated RF signals carries phase information; and a plurality of power amplification modules each being for receiving the pulse-modulated RF signals, amplifying power of each of the pulse-modulated RF signals and outputting the amplified pulse-modulated RF signals.

In another aspect of the present invention, a method of generating a pulse-modulated envelope signal carrying modulated RF signal is provided, including receiving pulse modulation control signals and RF input signals that carry phase information by using a signal modulation module; and modulating the RF input signals according to the pulse modulation control signals by using the signal modulation module, so as to generate pulse envelopes carrying RF signals that have phase information.

In yet another aspect of the present invention, a method of generating pulse-modulated envelope signals carrying phase information is provided, including combining a plurality of low density pulse envelope signals carrying modulated RF signals into a high density pulse envelope signal carrying modulated RF signals.

Compared to the prior art, the multi-phase pulse-modulated polar transmitter of the present invention uses multi-phase pulse modulation technique and similar pulse modulation techniques, and comprises a signal modulation module that receives pulse modulation control signals and constant-envelope modulated RF input singles and perform pulse modulation on the received constant-envelope RF input signals according to the received pulse modulation control signals, to generate pulse envelopes carrying modulated RF signals. The bandwidth can be enhanced, out-of-band emissions and harmonics can be suppressed, the efficiency of a power amplifier can be improved, and an envelope path and a phase path can be easily synchronized.

BRIEF DESCRIPTION OF DRAWINGS

A more complete understanding of the present invention can be derived by referring to the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

The First Embodiment

Figure 1:
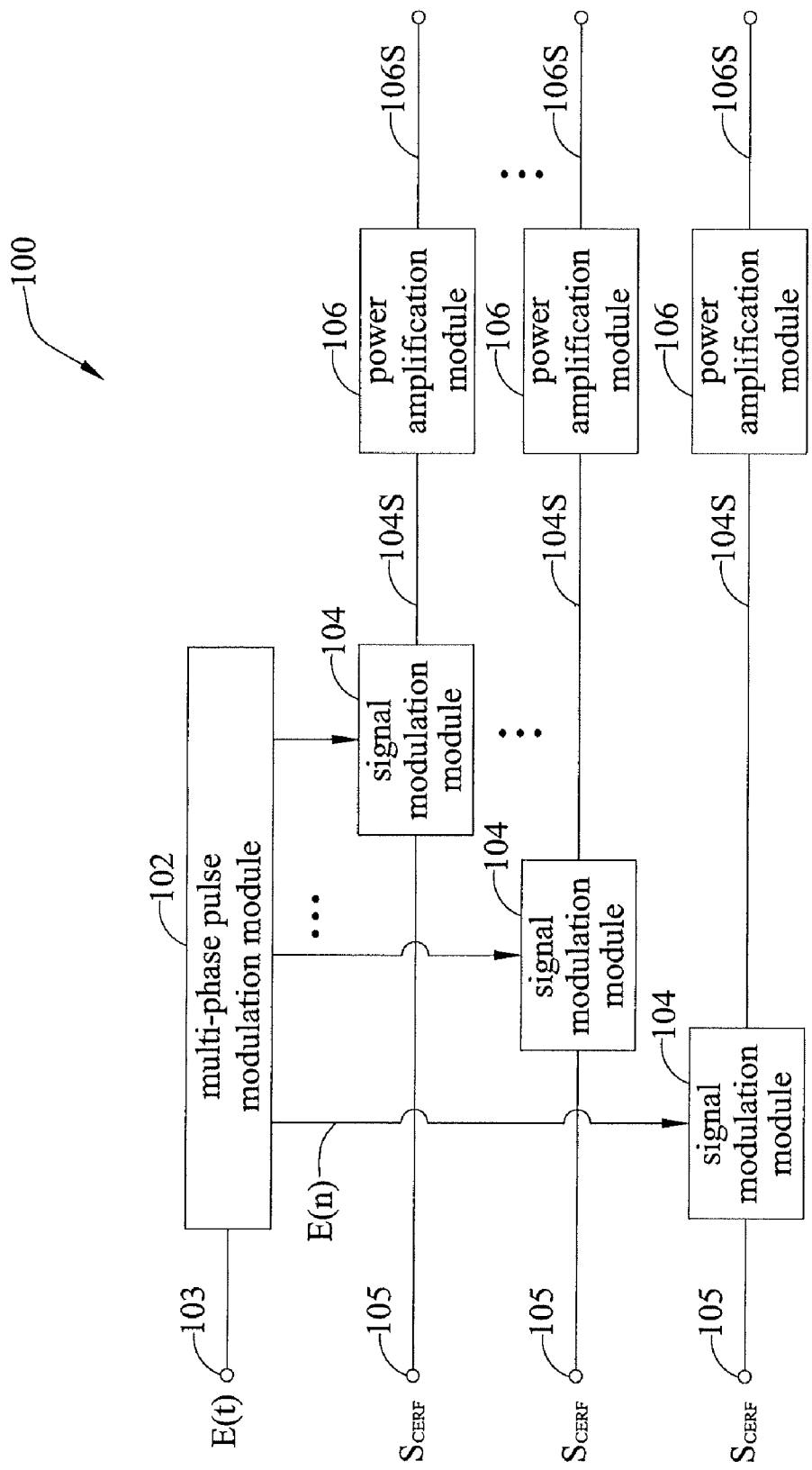
FIG. 1 is a functional diagram of a multi-phase pulse-modulated polar transmitter of a first embodiment according to the present invention.

FIG. 1 is a functional block diagram of a multi-phase pulse-modulated polar transmitter 100 of a first embodiment according to the present invention. The multi-phase pulse-modulated polar transmitter 100 comprises an envelope signal input end 103, a constant-envelope RF signal input end 105, a multi-phase pulse modulation module 102, a plurality of signal modulation modules 104, and a plurality of power amplification modules 106.

The envelope signal input end 103 receives envelope signal E(t). The constant-envelope RF signal input end 105 receives one of the constant-envelope modulated RF signals $S_{CERF}$.

The multi-phase pulse modulation module 102 receives the envelope signal E(t) and generates a plurality of multi-phase pulse-modulated signals E(n) that have different phases, by using a multi-phase pulse modulation technique.

The signal modulation modules 104 receive the constant-envelope modulated RF signals $S_{CERF}$. Each of the signal modulation modules 104 modulates one of the constant-envelope RF signals $S_{CERF}$ that it receives according to one of the multi-phase pulse-modulated signals E(n), and generates a pulse-modulated envelope signal carrying modulated RF signal 104S. Accordingly, each of the signal modulation modules 104 may perform a pulse modulation process on one of the constant-envelope RF signals $S_{CERF}$ that it receives according to the corresponding multi-phase pulse-modulated signal E(n).

In the first embodiment, the signal modulation modules 104 may be implemented by various signal modulators, such as mixers, switches, or logic circuits, etc. Note that the multi-phase pulse-modulated polar transmitter 100 of the present invention may also employ other pulse modulation techniques similar to the multi-phase pulse width modulation, such as the Σ-Δ modulation.

The power amplification modules 106 receive and amplify the pulse-modulated RF signals 104S from the signal modulation modules 104, and generate a plurality of output signals 106S with power being amplified.

Note that the envelope signals E(t) received at the envelope signal input end 103 are generated by the modulated RF input signals input at an RF input signal input end (not shown), and the constant-envelope RF signals $S_{CERF}$ received at the constant-envelope RF signal input ends are also generated by the modulated RF input signals input at the input signal input end. The modulated RF input signals generate the envelope signals E(t) and the constant-envelope RF signals $S_{CERF}$. The modulated RF input signals may be composed of the in-phase and quadrature signals (IQ signals). Preferably, the envelope signals E(t) are the square root of a sum of squares of in-phase signals I(t) and quadrature signals Q(t) of the modulated RF input signals, i.e., $E(t)=\sqrt{I^2(t)+Q^2(t)}$, An embodiment of a polar coordinate transmitter of the present invention is described in accordance with FIG. 2.

The Second Embodiment

Figure 2:
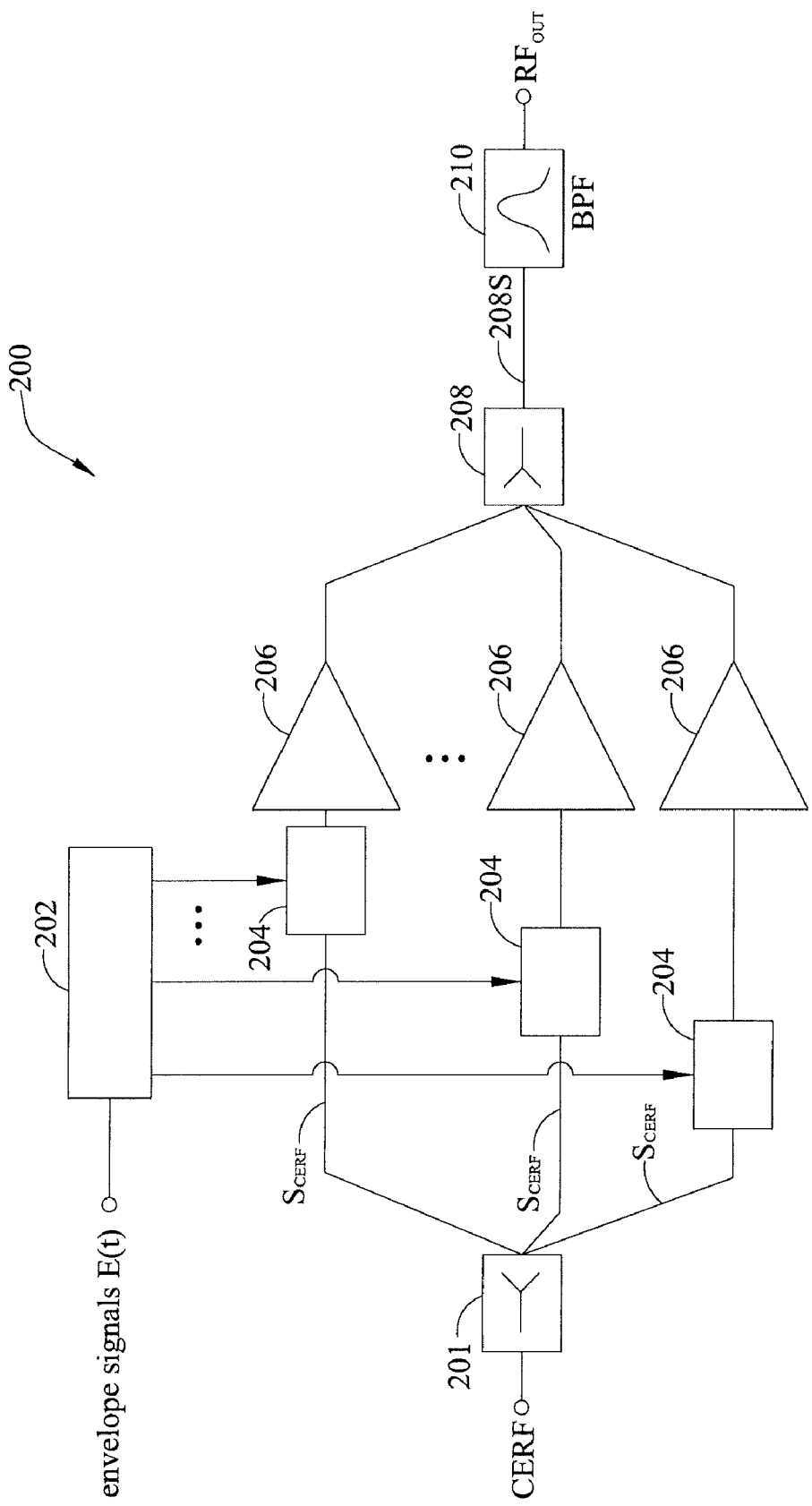
FIG. 2 is a functional diagram of a multi-phase pulse-modulated polar transmitter of a second embodiment according to the present invention.

FIG. 2 is a circuit diagram of a multi-phase pulse-modulated polar transmitter 200 of the second embodiment according to the present invention. The multi-phase pulse-modulated polar transmitter 200 comprises a power divider 201, a multi-phase pulse modulator 202, a plurality of signal modulators 204, a plurality of RF power amplifiers 206, a power combiner 208 and a band-pass filter 210.

The power divider 201 receives the constant-envelope RF signal CERF of the modulated RF input signal, and divides it into a plurality of constant-envelope RF signals $S_{CERF}$ that may have the same or different power.

The multi-phase pulse modulator 202 receives and performs a multi-phase pulse modulation process on the envelope signal E(t) of the modulated RF input signal, and generates a plurality of multi-phase pulse-modulated signals that have different phases. The multi-phase pulse-modulated signals are then sent to the corresponding signal modulators 204. In the second embodiment, the multi-phase pulse modulator 202 may be a pulse width modulators or $\Sigma$-$\Delta$ modulator.

The signal modulators 204 receive the corresponding constant-envelope RF signals $S_{CERF}$. Each of the signal modulators 204 modulates one of the constant-envelope RF signals $S_{CERF}$ that it receives according to its corresponding multi-phase pulse-modulated signal, and generates pulse-modulated RF signals that have pulse envelope. In the second embodiment, the $\Sigma$-$\Delta$ modulation technique, as well as the multi-phase pulse width modulation technique, may be used to achieve the object of modulating the constant-envelope RF signals $S_{CERF}$. In the present invention, the signal modulator 204 may be implemented by transistors such as a single-pole single-throw CMOS switch, discrete circuit switching component, or any other circuit components that may have a signal modulation effect. For example, the signal modulators 204 may be implemented by various signal modulators, mixers, switches or logic circuits. A plurality of RF power amplifiers 206 that are in the same size or different sizes may be implemented in the second embodiment.

The RF power amplifiers 206 receive and amplify the pulse-modulated RF signals out from the signal modulators 204, and output a plurality of output signals with power being amplified. In the second embodiment, high-efficiency power amplifiers are used to implement the RF power amplifiers 206. Also, the RF power amplifiers 206 may have the same weights, to achieve a better output effect.

The power combiner 208 receives and combines the output signals from the RF power amplifiers 206, and generates the amplified pulse-modulated RF signals 208S. In the second embodiment, a Wilkinson power combiner is used to implement the power combiner 208, for combining the output signals, with the power being amplified, into a single output path, and outputting the pulse-modulated RF output signals 208S.

The band-pass filter 210 receives the pulse-modulated RF output signals 208S output from the power combiner 208. The band-pass filter 210 has a predetermined passband to filter switching harmonic components of the pulse-modulated RF output signals.

The Third Embodiment

A multi-phase pulse-modulated polar transmitter according to the present invention may be applied to a wireless mobile device for various standards. Please refer to FIG. 3, which describes in details a multi-phase pulse-modulated polar coordinate transmitter of the third embodiment according to the present invention.

In the third embodiment, a data generator 301 is used to generate multi-phase PWM signals E(n)" and baseband vector signals I(n) and Q(n) directly. A plurality of signal modulation modules 304 are the same as the signal modulators 204 described in the second embodiment shown in FIG. 2. The baseband vector signals I(n) and Q(n) are two baseband vector signals that are orthogonal to each other, and are input to digital-analog converters 301a and vector modulator 301b sequentially to generate constant-envelope modulated RF signals. Each of the signal modulation modules 304 modulates the received constant-envelope RF signals carrying the phase information according to the received PWM signals E(n)", and generates corresponding pulse envelopes carrying modulated RF signals. A band-pass filter 310 is serially connected to output ends of the RF power amplifiers 306 to filter unwanted switching harmonics.

The present invention uses multi-phase pulse modulation technique to resolve the problems of spurious emissions. RF output signals are restored by filtering the multi-phase pulse-modulated envelope signals carrying modulated RF signals.

The present invention uses a multi-phase pulse modulation technique to enhance the bandwidth of a transmitter and reduce spurious noises. With the use of the multi-phase technique, the harmonic components resulted from the pulse modulation may be pushed out from the carrier frequency of RF signals, and ease the filtering requirements. For an N-phase pulse-modulated polar transmitter with each phase properly matched, only the p N-th harmonics remain. The p·N-th harmonics are located at $f_{p \cdot N} = f_c \pm p \cdot N \cdot f_{PM}$, where p is an integer, $f_c$ is the carrier frequency, and $f_{PM}$ the pulse modulation frequency. This property has a significant effect on removing the out-of-band emissions created by the pulse modulation.

Please refer to FIGS. 4A to 4D, which show harmonics close to the modulated carrier, with different number of phases of multi-phase pulse modulation. The harmonics may be removed easily with the use of a serially connected high quality filter. Furthermore, the filter may be a SAW filter that is serially connected to an antenna or a transmitter output end. Besides the enhancement in the bandwidth of a transmitter, the use of multi-phase PWM technique may also reduce noises by increasing an equivalent pulse modulation rate.

Figure 5:
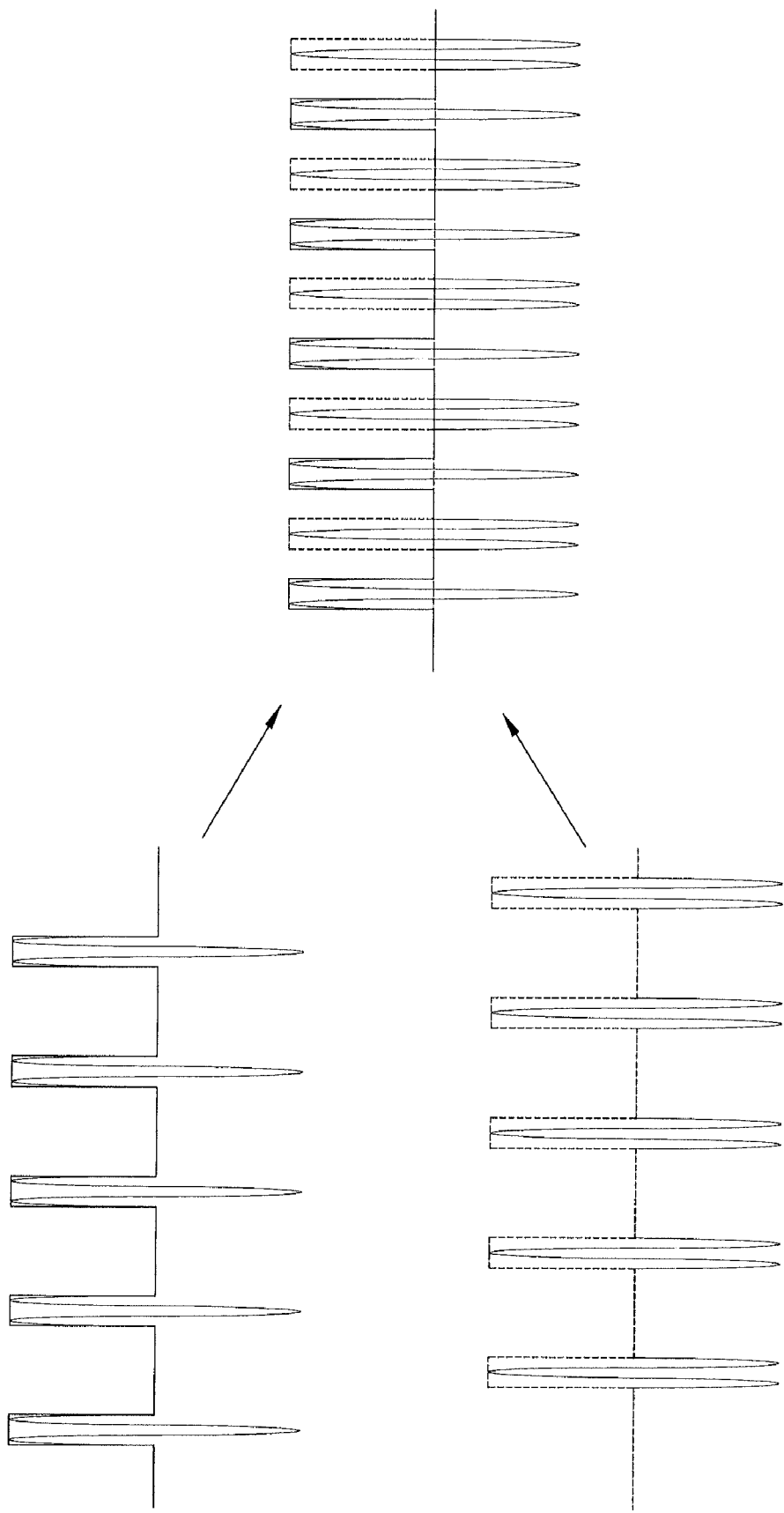
FIG. 5 is a schematic diagram illustrating that multi-phase PWM may increase an equivalent pulse modulation rate.

Please refer to FIG. 5, which depicts an example of multi-phase PWM that may increase an equivalent pulse modulation rate.

It can be known from the combining process of the multi-phase PWM shown in FIG. 5 that two different low density pulse envelopes carrying modulated RF signals shown at a left-hand side of FIG. 5 may be combined to obtain a high density pulse envelope carrying modulated RF signals as shown at the right-hand side of FIG. 5. Note that the aforesaid densities indicate a number of pulse envelopes in a unit time. The number of different pulse envelopes that are to be combined is not limited to two, as shown in the left-hand side of FIG. 5, pulse envelopes having different phases of any number greater than two may be combined.

Figure 3:
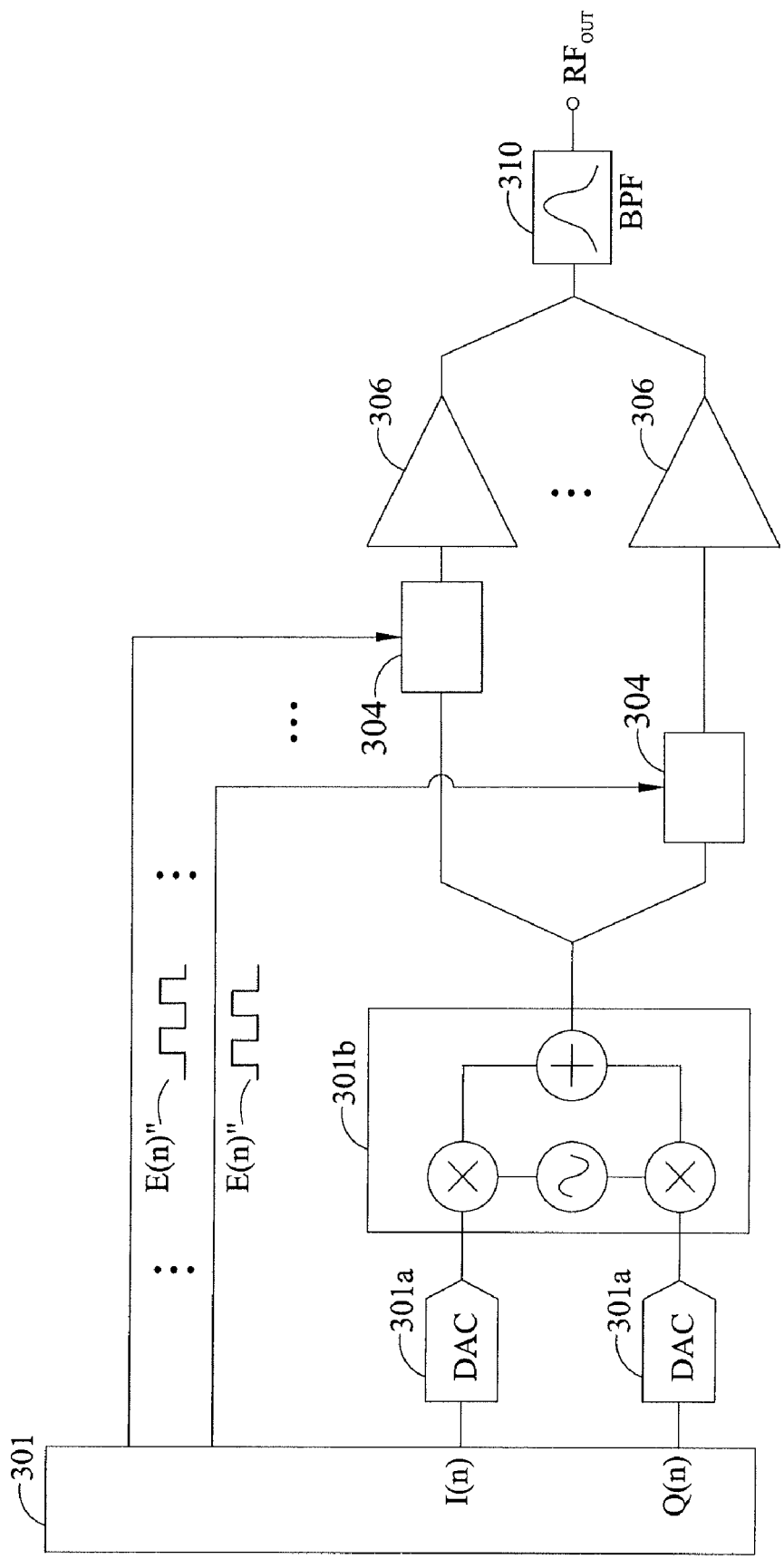
FIG. 3 is a functional diagram of a multi-phase pulse-modulated polar transmitter of a third embodiment according to the present invention.
Figure 4A:
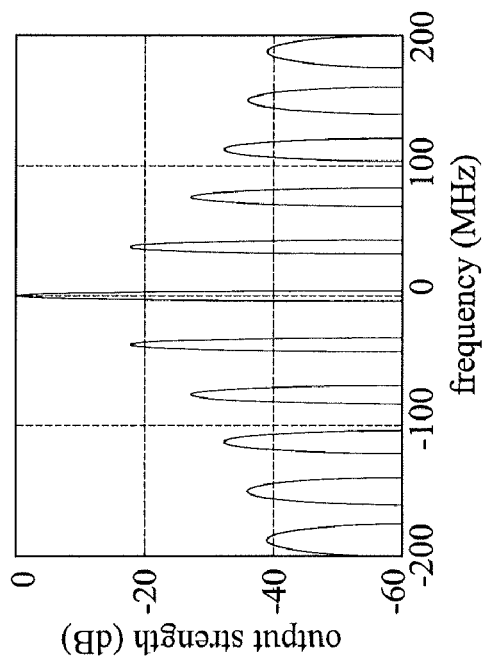
FIG. 4A is an output spectrum obtained from a 1-phase pulse-modulated circuit structure shown in FIG. 3.
Figure 4B:
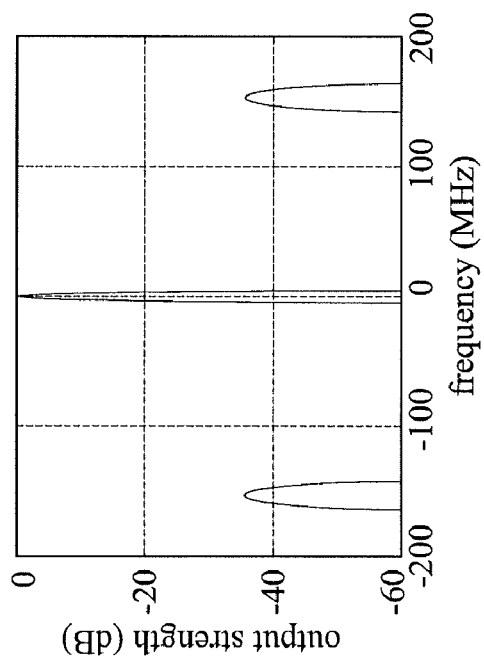
FIG. 4B is an output spectrum obtained from a 2-phase pulse-modulated circuit structure shown in FIG. 3.
Figure 4C:
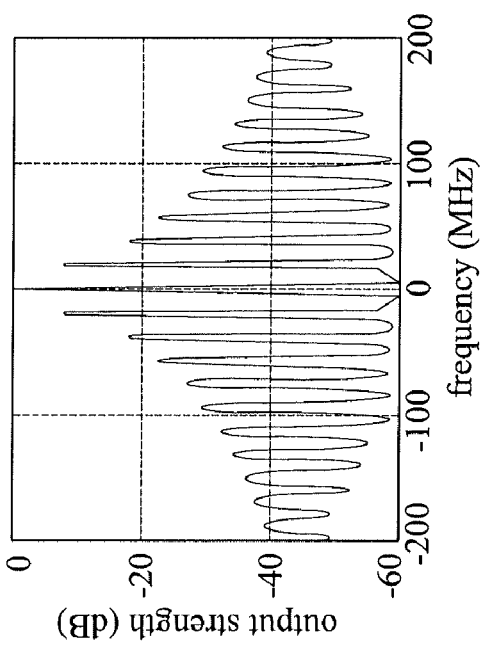
FIG. 4C is an output spectrum obtained from a 4-phase pulse-modulated circuit structure shown in FIG. 3.
Figure 4D:
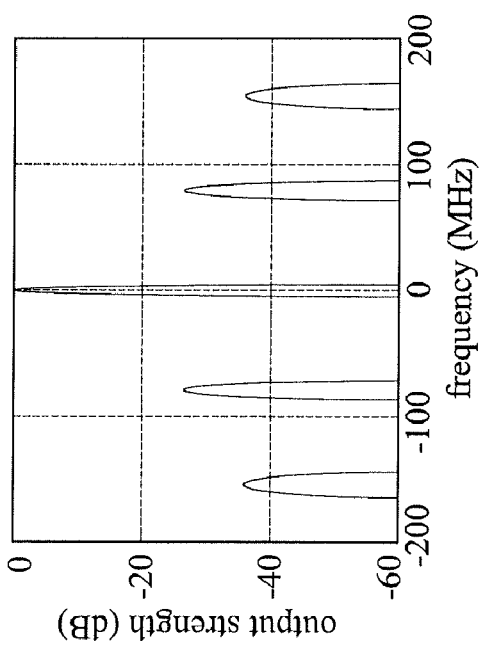
FIG. 4D is an output spectrum obtained from a 8-phase pulse-modulated circuit structure shown in FIG. 3.
Figure 6:
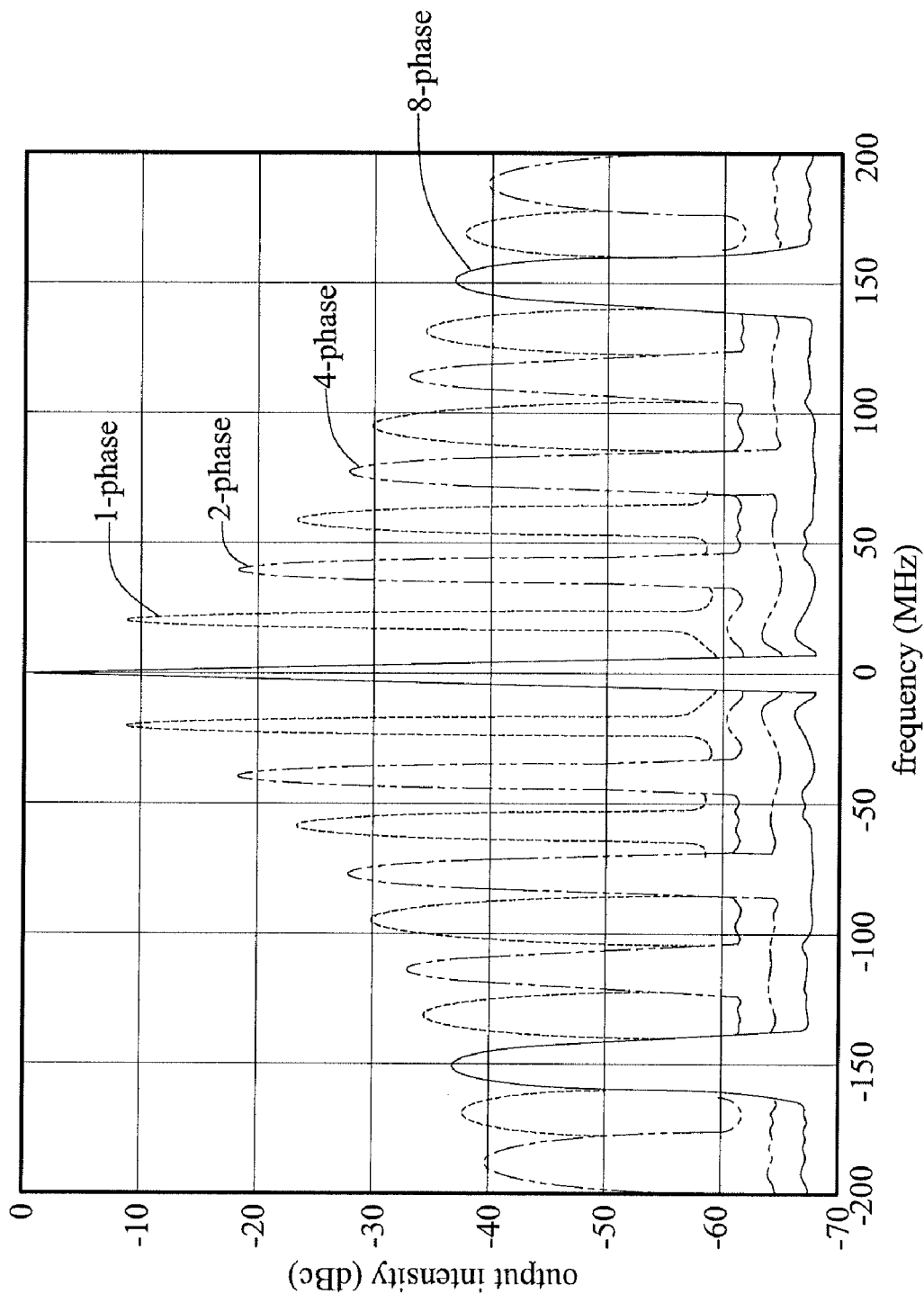
FIG. 6 is an output spectrum obtained by applying the circuit structure shown in FIG. 3 to different numbers of phases.

FIG. 6 is an output spectrum obtained by applying the circuit structure shown in FIG. 3 to different numbers of phases. FIG. 6 shows that increasing the number of phases may push the harmonic components resulted from the pulse modulation out from the carrier frequency of RF signals and reduce the first harmonics closest to the carrier frequency. By comparing the output spectrums of various PWM signals that have different numbers of phases, the reduction of the aforesaid harmonic components may be verified.

In conclusion, the multi-phase pulse-modulated polar coordinate transmitter of the present invention uses the multi-phase pulse modulation technique to enhance the bandwidth of a transmitter and reduce the out-of-band emissions, without the use of digital pre-distortion. In addition, the use of multi-phase pulse modulation technique may suppress the harmonics generated during the pulse modulation process and makes it easier to filter the unwanted out-of-band emissions, to achieve the effect of reducing noises and harmonics.

Figure 7:
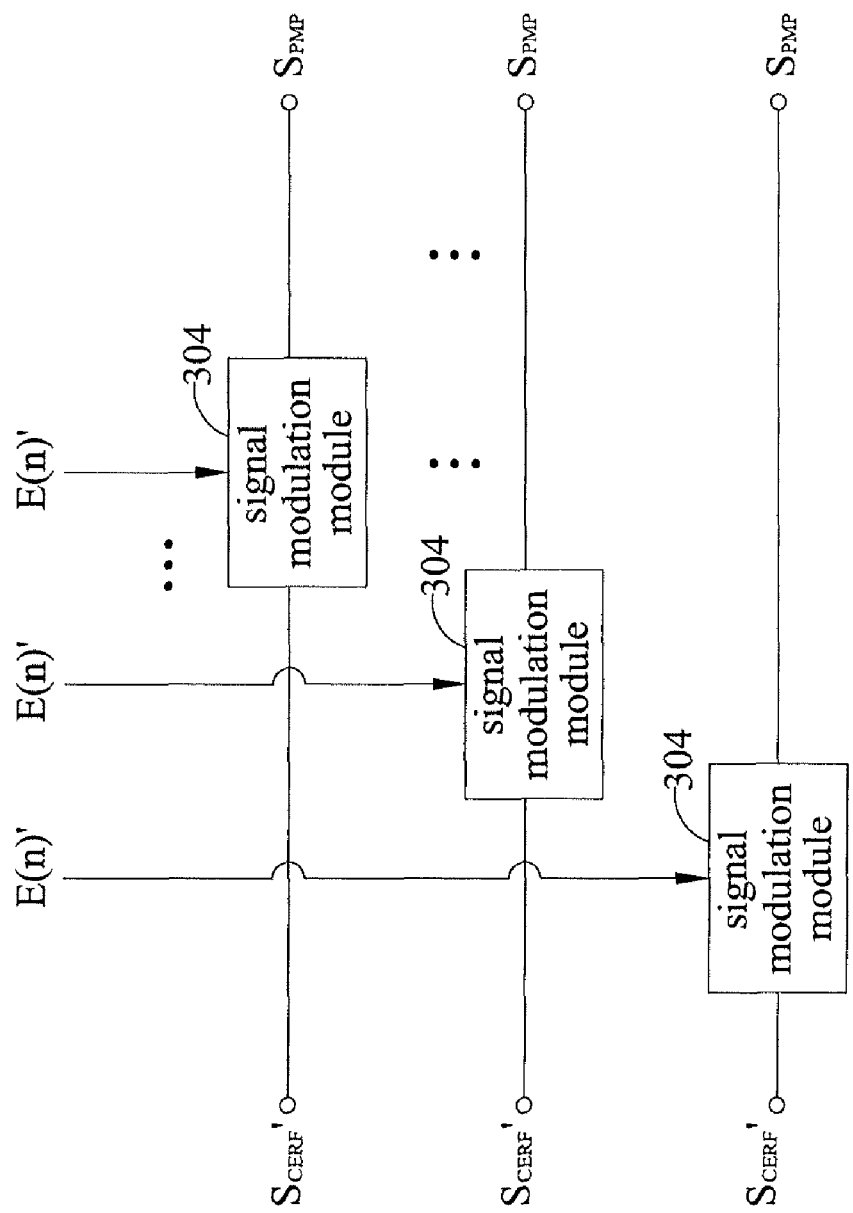
FIG. 7 is a schematic diagram of a basic structure that implements a method of generating pulse-modulated envelope signals carrying modulated RF signals.

FIG. 7 is a schematic diagram of a basic structure that implements a method of generating pulse-modulated envelope signals carrying modulated RF signals. The method uses a plurality of signal modulation modules 304 to receive a plurality pulse modulation control signals E(n)' and a plurality of modulated RF input signals $S_{CERF}'$. Each of the signal modulation modules 304 performs pulse modulation on the received RF input signals $S_{CERF}'$ according to the received pulse modulation control signals E(n)', and generates the corresponding pulse envelopes carrying modulated RF signals $S_{PMP}$. In the embodiment, the pulse modulation control signals E(n)' may have different phases, and the RF input signals $S_{CERF}'$ are modulated constant-envelope RF signals.

Compared to the prior art, the multi-phase pulse-modulated polar transmitter of the present invention uses multi-phase pulse modulation technique and similar pulse modulation techniques, and comprises a signal modulation module that receives pulse modulation control signals and modulated constant-envelope RF input signals and performs pulse modulation on the received constant-envelope RF input signals according to the received pulse modulation control signals, to generate pulse envelopes carrying modulated RF signals. Therefore, the bandwidth is enhanced, out-of-band emissions and harmonics are suppressed, the efficiency of a power amplifier is improved, and an envelope path and a phase path can be easily synchronized.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A multi-phase pulse-modulated polar transmitter, comprising:
    an envelope signal input end for receiving envelope signals;
    a plurality of constant-envelope radio-frequency (RF) signal input ends, each being for receiving input constant-envelope RF signals;
    a multi-phase pulse modulation module for receiving the envelope signals from the envelope signal input ends, so as to generate multi-phase (or multi-bit) pulse modulation signals according to the envelope signals;
    a plurality of signal modulation modules, each being for receiving one of the constant-envelope RF signals and modulating the received one of the constant-envelope RF signals according to one of the multi-phase (or multi-bit) pulse modulation signals, to thereby generate pulse-modulated RF signals that an envelope of each of the pulse-modulated RF signals carries phase information; and
    a plurality of power amplification modules, each being for receiving the pulse-modulated RF signals, amplifying power of each of the pulse-modulated RF signals and outputting the amplified pulse-modulated RF signals.

2. The multi-phase pulse-modulated polar transmitter of claim 1, wherein the multi-phase pulse modulation module is a pulse width modulator or a $\Sigma$-$\Delta$ modulator.

3. The multi-phase pulse-modulated polar transmitter of claim 1, wherein the constant-envelope RF signals received by the plurality of constant-envelope RF signal input ends are generated by a power divider according to RF input signals input into the power divider.

4. The multi-phase pulse-modulated polar transmitter of claim 3, further comprising a power combiner for receiving and combining the amplified pulse-modulated RF signals from the power amplification modules and generating and outputting pulse-modulated RF output signals.

5. The multi-phase pulse-modulated polar transmitter of claim 4, further comprising a band-pass filter for receiving the pulse-modulated RF output signals from the power combiner, wherein the band-pass filter has a predetermined frequency band to filter out the switching harmonic components of the pulse-modulated RF output signals.

6. A method of generating pulse-modulated envelope signals carrying modulated RF signal, comprising:
    receiving pulse modulation control signals and modulated constant-envelope RF input signals by using a signal modulation module; and
    modulating the constant-envelope RF input signals according to the pulse modulation control signals by using the signal modulation module, so as to generate pulse envelopes carrying modulated RF signals.

7. The method of claim 6, wherein the pulse modulation control signals are pulses or digital signals that are generated according to magnitude of the envelope signal.

8. The method of claim 6, wherein the constant-envelope RF input signals have constant-envelopes.

9. A method of generating a pulse-modulated envelope signal carrying modulated RF signal, comprising:
    combining a plurality of low density pulse envelopes carrying modulated RF signals into a high density pulse envelope carrying modulated RF signal.

* * * * *